United States Patent [19]

Fuchs

[11] Patent Number: 5,209,669
[45] Date of Patent: May 11, 1993

[54] PLUG-IN PROXIMITY SWITCH

[75] Inventor: Helmut Fuchs, Halver, Fed. Rep. of Germany

[73] Assignee: Karl Lumberg GmbH & Co., Schalksmuhle, Fed. Rep. of Germany

[21] Appl. No.: 854,411

[22] Filed: Mar. 19, 1992

[30] Foreign Application Priority Data

Mar. 19, 1991 [DE] Fed. Rep. of Germany ....... 4108887

[51] Int. Cl.$^5$ ............................................. H01R 9/09
[52] U.S. Cl. ................................. 439/59; 439/76; 439/276; 439/630
[58] Field of Search ............. 439/59, 76, 276, 629, 439/630, 632, 636

[56] References Cited

U.S. PATENT DOCUMENTS

| | | | |
|---|---|---|---|
| 3,787,801 | 1/1974 | Teagno et al. | 439/630 |
| 4,129,351 | 12/1978 | Sugimoto et al. | 439/630 |
| 4,551,579 | 11/1985 | Takasaki | 439/422 |
| 4,726,775 | 2/1988 | Owen | 439/630 |
| 4,919,626 | 4/1990 | Annalt et al. | 439/59 |

FOREIGN PATENT DOCUMENTS 3840678 3/1992 Fed. Rep. of Germany .

Primary Examiner—Paula A. Bradley
Attorney, Agent, or Firm—Herbert Dubno; Andrew Wilford

[57] ABSTRACT

A plug-in proximity switch has a tubular housing having a hollow interior and an open end, a circuit board in the housing interior having an edge adjacent the end and a face provided adjacent the edge with a plurality of circuit paths, a socket fittable with the open housing end, a socket body in the socket adjacent the board edge, and a plurality of connector elements fixed in and projecting inward from the body and directly engaging the circuit paths of the board. The board is rigidly held in the housing by a mass of hard potting compound filling the housing interior around the board at least at the edge thereof.

5 Claims, 2 Drawing Sheets

PLUG-IN PROXIMITY SWITCH

FIELD OF THE INVENTION

The present invention relates to a proximity detector or switch. More particularly this invention concerns such a device that is made to be plugged in as a single unit.

BACKGROUND OF THE INVENTION

A standard plug-in proximity switch has a tubularly cylindrical housing containing a printed-circuit board carrying the active and passive elements of the switch. One end of the housing is formed as a plug that can be fitted to a socket to install the unit. The circuit, which is invariably mounted on a printed-circuit board, must be fitted with a plug that can be inserted into a socket for connection to the equipment or installation it is used in. As a rule the board is contained in a housing and is largely surrounded by insulating potting compound. A plug assembly with projecting connection pins is mounted on one end of the housing and is connected inside the housing with the circuit board.

Such a proximity switch is described in German utility model 8,709,199. In it the connection between the circuit board and the plug elements is made by conductive leads whose inner ends are soldered to contact points on the circuit board which is then fitted into a tubular housing or initiator tube. The tube is then stood on end and at least partially filled with the insulating potting compound, which hardens. Subsequently the plug elements are soldered to outer ends of the leads and the plug unit is fixed in the open end of the tubular housing.

As also described in German patent 3,840,678 it is known to provide a fill passage or hole in the plug so that once the entire unit is assembled, it can be completely filled with potting compound. This makes the assembly very rugged.

The main disadvantage of this arrangement is that it is fairly bulky and expensive to make. The leads must be accommodated between the plug and the circuit board, and connecting both ends of the leads is fairly time consuming and, in fact, capable of producing a crosswiring error.

OBJECTS OF THE INVENTION

It is therefore an object of the present invention to provide an improved plug-in proximity switch.

Another object is the provision of such an improved plug-in proximity switch which overcomes the above-given disadvantages, that is which is fairly compact, inexpensive to manufacture, and robust.

SUMMARY OF THE INVENTION

A plug-in proximity switch according to the invention has a tubular housing having a hollow interior and an open end, a circuit board in the housing interior having an edge adjacent the end and a face provided adjacent the edge with a plurality of circuit paths, a socket fittable with the open housing end, a socket body in the socket adjacent the board edge, and a plurality of connector elements fixed in and projecting inward from the body, and directly engaging the circuit paths of the board. The board is rigidly held in the housing by a mass of hard potting compound filling the housing interior around the board at least at the edge thereof.

Thus with the system of this invention there are no connector leads in the proximity switch. Instead the socket connects directly to its circuit board. As a result the assembly is substantially more compact than has been possible hitherto. The possibility of the connector leads failing or being miswired is eliminated.

According to the invention the connector elements are formed as respective spring tongues each bearing resiliently directly on a respective one of the circuit paths. The spring tongues are all aligned in a row parallel to the circuit board. Furthermore each of the connector elements is formed with a U-shaped clip having arms one of which forms the respective tongue, the clips gripping the board at the edge. The tongues have pointed ends that dig into the respective paths and are unitary with the respective elements.

BRIEF DESCRIPTION OF THE DRAWING

The above and other objects, features, and advantages will become more readily apparent from the following, reference being made to the accompanying drawing in which.

SPECIFIC DESCRIPTION

Figure 2:
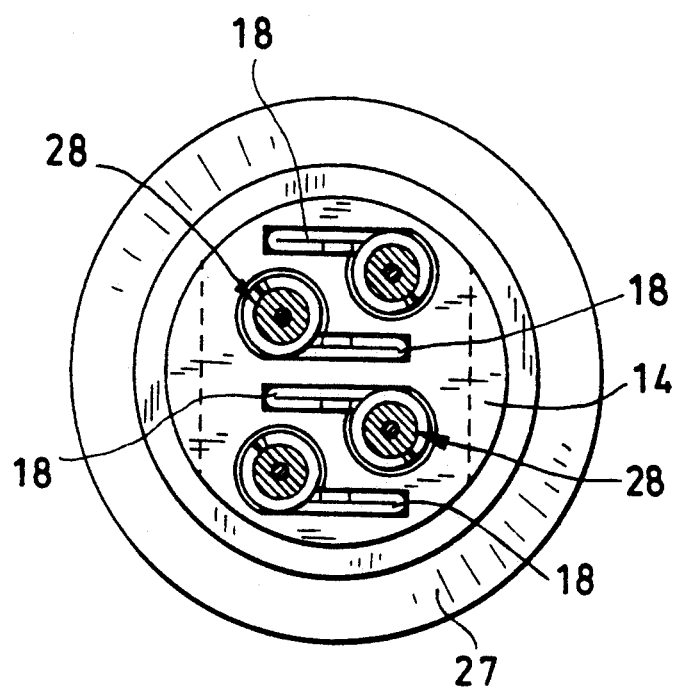
FIG. 2 is a section taken along line II—II of FIG. 1.
Figure 1:
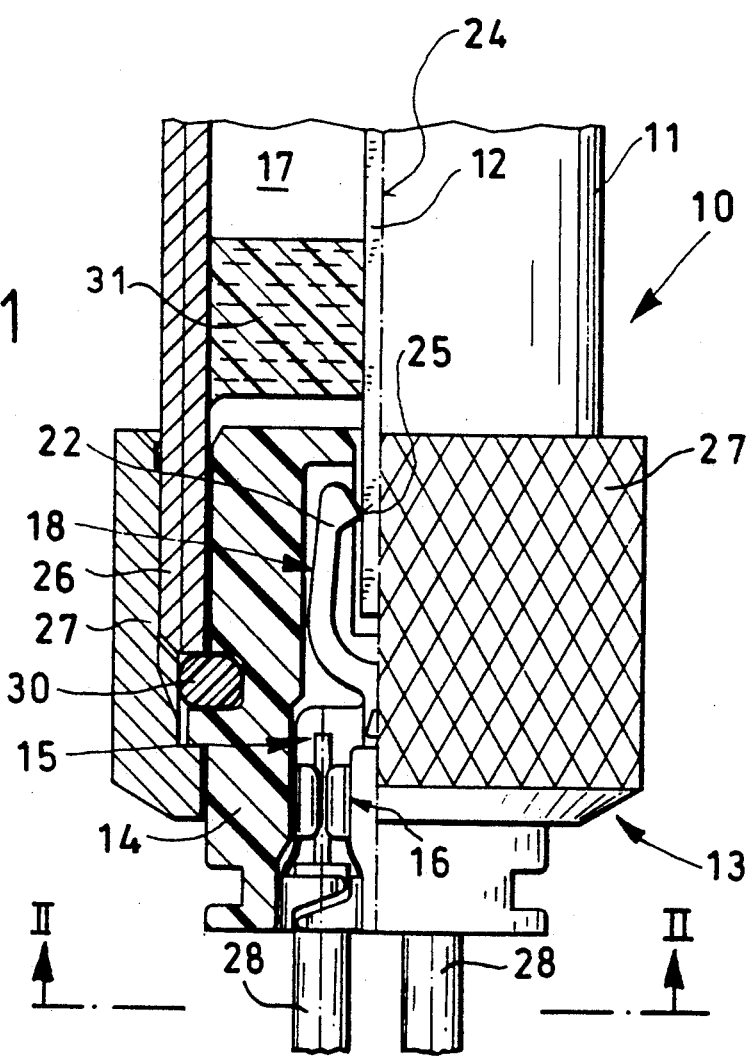
FIG. 1 is a side view partly in axial section through the proximity-switch assembly according to this invention.
Figure 4:
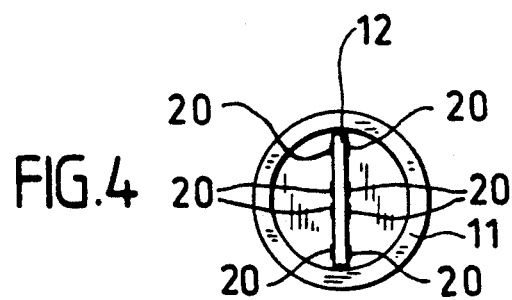
FIG. 4 is a bottom view of the switch taken along line IV—IV of FIG. 3.
Figure 3:
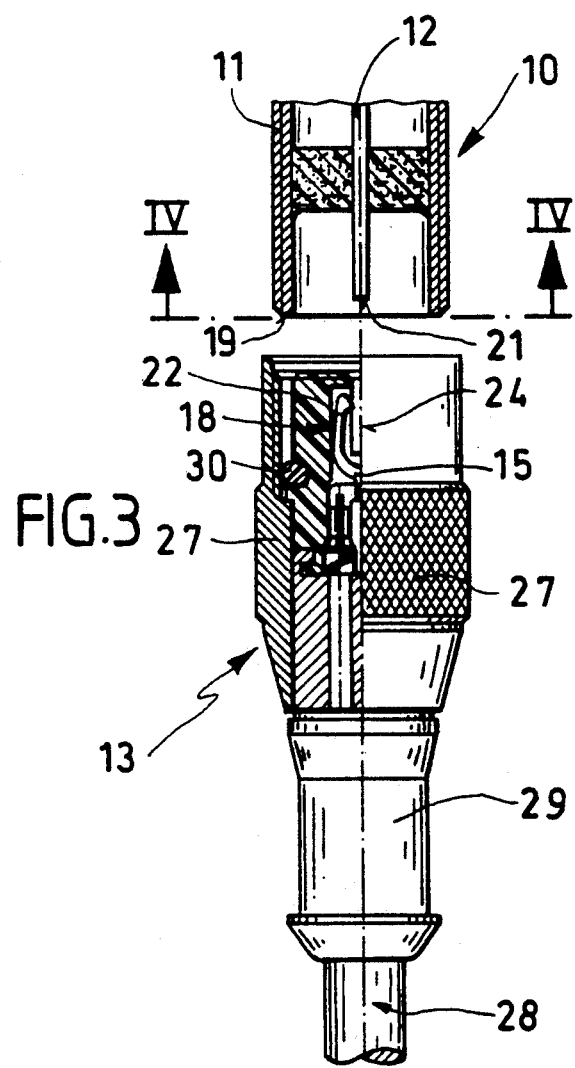
FIG. 3 is a smaller-scale partly sectional side view of the assembly.

As seen in the drawing a proximity switch 10 according to this invention comprises an element-carrying circuit board 12 lying on the axially centered symmetry plane 24 of a cylindrically tubular housing 11. Insulating potting 31 secures the board 12 in the interior 17 of the housing 11. The board 12 has an outer edge 21 projecting axially on the plane past the potting 31 and is provided on each of its planar faces with four conductive strips 20 that can be part of the printed circuit on the board 12 or simply provided for connection to the elements on the board 12. The housing 11 has an open end 19 formed externally with a screwthread 26.

A socket connector 13 has an internally threaded holding nut 27 that can mate with the threads 26 and a central insulating body 14 provided with four connector elements 15, one for each of the contact strips 20. An O-ring 30 is set in a groove in the body 14 to engage the end of the housing 11 and seal the joint between the switch 10 and the socket 13 and a molded-on cable protector 29 is provided on the body 14. Each connector element 15 has an outer part 16 formed as a clamp for a conductor of a respective cable 28 and, unitarily therewith, an inner fork or clip 18 having a pair of spring tongues 22 capable of gripping the board edge at the respective conductors 20. The tongues 22 have pointed ends 25 that bite into the conductors 22 to ensure a good electrical connection therewith.

In the illustrated embodiment the spring tongues 22 of each connector element 15 engage both sides of the board 12 at the respective conductive strips 20. This ensures automatic stress-free centering of the parts in each other. It is of course also possible to dispense with one of the tongue-forming arms 22 of each clip 18 since the potting 31 alone will prevent lateral shifting of the board 12. In this case, however, it is advisable to alternate the tongues 22 from one side to the other of the board 12.

Other variations are also possible within the scope of the invention. For instance the threaded connection between the switch 10 and socket 13 could be replaced by a bayonet or snap-in connection. There could be more or less than the four connectors 15, and the wires 28 could be differently arrayed.

I claim:

1. A plug-in proximity-switch assembly comprising:
 a tubular housing having a hollow interior and an open end;
 a circuit board in the housing interior having an edge adjacent the end and a face provided adjacent the edge with a plurality of circuit paths;
 a mass of hard potting compound filling the housing interior around the board at least at the edge thereof and rigidly holding the board in the housing;
 a socket fittable with the open housing end;
 a socket body in the socket adjacent the board edge; and
 a plurality of connector elements fixed in and projecting inward from the body, and directly engaging the circuit paths of the board.

2. The plug-in proximity-switch assembly defined in claim 1 wherein the connector elements are formed as respective spring tongues each bearing resiliently directly on a respective one of the circuit paths.

3. The plug-in proximity-switch assembly defined in claim 2 wherein the tongues have pointed ends that dig into the respective paths.

4. The plug-in proximity-switch assembly defined in claim 2 wherein the spring tongues are all aligned in a row parallel to the circuit board.

5. The plug-in proximity-switch assembly defined in claim 4 wherein each of the connector elements is formed with a U-shaped clip having arms one of which forms the respective tongue, the clips gripping the board at the edge.

* * * * *